METHOD OF PREPARING FILMS OF CONTROLLED RESISTIVITY
Filed May 9, 1966
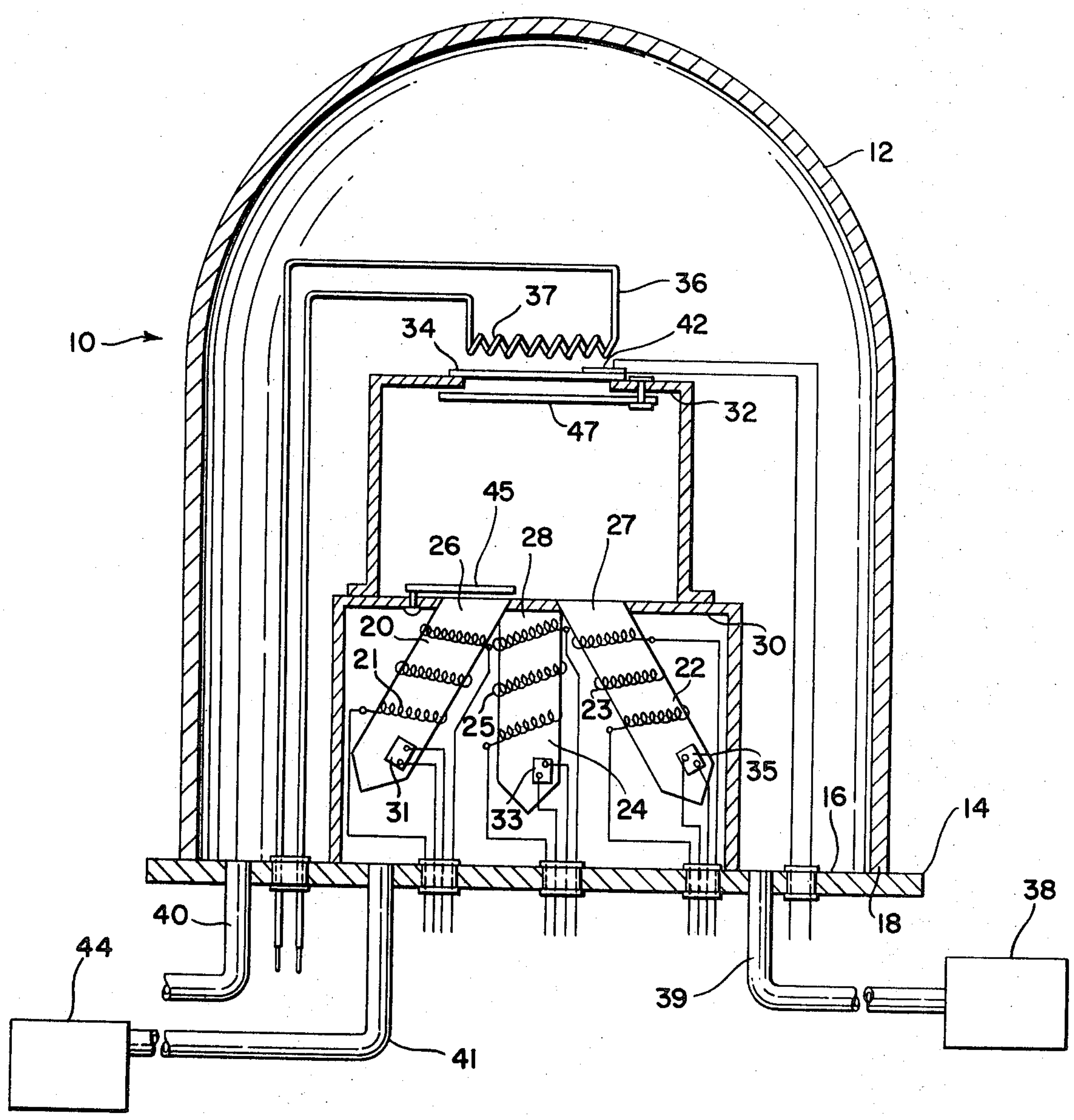
INVENTORS
NORMAN E. HEYERDAHL &
DONALD J. HARVEY
BY
Meyer, Tilberry & Body
ATTORNEYS United States Patent Office 3,531,335

Patented Sept. 29, 1970

3,531,335
METHOD OF PREPARING FILMS OF CONTROLLED RESISTIVITY

Norman E. Heyerdahl, Cleveland, and Donald J. Harvey, Findlay, Ohio, assignors, by mesne assignments, to Kewanee Oil Company, Bryn Mawr, Pa., a corporation of Delaware Filed May 9, 1966, Ser. No. 548,781
Int. Cl. H01l 7/36
U.S. Cl. 148—174 18 Claims

ABSTRACT OF THE DISCLOSURE

This invention comprises a method of preparing a compound semi-conductor film having controlled resistivity, involving the steps of supporting a substrate, such as glass, molybdenum, etc., in an atmosphere-controlled chamber, simultaneously vaporizing in said chamber a Periodic Group VI material such as sulfur, selenium or tellurium, and a Periodic Group II material such as zinc, cadmium or mercury, while said substrate is heated to a temperature between 150° C. and 500° C., allowing said vaporized materials to form a compound film on an exposed surface of said substrate, and after formation of said compound film discontinuing vaporization of the Group VI material and allowing the film to cool while still being bombarded by vapor of said Group II material. The resultant films have low resistivity and serve as an efficient photovoltaic cell having a low ratio weight to external generated electrical energy.

The present invention pertains to the art of forming semiconducting devices and more particularly to a method of forming a compound semiconductor film having a controlled resistivity.

This invention is particularly applicable to the formation of a cadmium telluride film, and it will be discussed with particular emphasis thereto; however, it will be appreciated that the invention has much broader applications and may be used in the production of other semiconducting films formed from a compound including a group II material, such as zinc, cadmium and mercury and a group VI material, such as sulfur, selenium, and tellurium.

Certain materials which are photoconductive, i.e. materials having drastically different conductivity in response to light waves, have been found to have photovoltaic properties, i.e. capability of generating electrical energy upon exposure to light waves of various wavelengths. The present invention is directed toward materials which have photovoltaic capabilities in a range which makes them adapted for use as energy sources where a battery is too heavy and a conventional electrical generator is unavailable, especially, photovoltaic materials which are adapted for use in space. In addition, materials formed in accordance with this invention are applicable for use as photoconductive cells, ultrasonic transducers, thin film circuits, and other related devices. However, the use of the materials produced in accordance with the present invention for photovoltaic cells will be expressly explained.

Initially, photovoltaic cells or units of the type to which the invention is directed were produced from single crystals of semiconductor materials, such as germanium and silicon. These materials were expensive to produce, and the photovoltaic effect was provided by the difficult and critical task of attaching a rectifying electrode onto the crystal. These cells exhibited a high ratio of weight to externally generated electrical power. This feature was a pronounced disadvantage for use of these devices in outer space. To produce a given amount of usable energy, the complex or unit built from single crystals of silicon, or maybe germanium, were excessively heavy. This weight lowered the "pay load" of a satellite carrying the cells. In addition, these single crystal photovoltaic devices were adversely affected by radiation and their useful life in space was limited.

Single crystal cadmium sulfide cells were also being developed about the same time as the silicon cells. These cells were not affected to a great extent by radiation; however, they did have a serious disadvantage. The efficiency and ratio of external electrical energy to weight were both low.

Although the weight to external generated energy ratio is dependent on many factors, the major factors affecting this ratio are the internal or actual electrical energy developed per weight of material and the internal or intrinsic resistivity of the material. The internal resistivity of the material limits the electrical energy supplied externally of the cell. Also, the weight of the supporting structure adversely affects this critical ratio. Taking these factors into consideration, the single crystal cadmium sulfide cells have not been completely successful. Thus, polycrystalline cadmium sulfide cells have been developed. These cells are formed from a multitude of single crystals formed into a thin film, and they exhibit relatively high efficiencies and have a high ratio of output energy to weight of approximately 50–75 watts per pound. Because of this high energy to weight ratio these polycrystalline cadmium sulfide cells have become widely proposed for use where weight is a factor, i.e. in space or mobile appliances.

In recent years, it has been found that the photovoltaic effect of the photovoltaic cells fabricated from cadmium telluride is in some respects even better than the photovoltaic effect of cadmium sulfide. Consequently, considerable development efforts have been directed toward vacuum evaporated thin polycrystalline film from cadmium telluride for general semiconducting use. These efforts have been, before our invention, commercially unsuccessful. Although a high level photovoltaic effect can be produced in vacuum evaporated cadmium telluride film, the resistivity of these evaporated films has been found to be prohibitively high. For instance, the resistivity of this film is approximately $1.0 \times 10^8$ ohm-cm. or more. With this level of resistivity, the internal resistance of the cell cancels any benefits obtained by the higher photovoltaic effect caused by using cadmium telluride. All efforts to reduce the resistivity of the vacuum evaporated cadmium telluride film have been unsuccessful. Doping the evaporated film with group III–A materials, such as indium and gallium, has not, before our invention, reduced the resistivity to less than approximately $1.0 \times 10^7$ ohm-cm.

The present invention relates to the production of a vacuum evaporated cadmium telluride film which has a substantially lowered resistivity and, more broadly, to controlling the resistivity of films formed from compounds of group II and group VI materials.

In accordance with the present invention there is provided a method of forming a film which may be used as a photovoltaic film or for other semiconducting films. This method comprises the steps of: providing an atmosphere controlled chamber; supporting a substrate in the chamber with an exposed surface; simultaneolsly evaporating a group II material and a group VI material, or a compound of one of these materials and one of the group II or VI materials, in the chamber; heating the substrate to a temperature between 150° C. and 500° C.; holding the substrate at this temperature; allowing the evaporated material to form a compound film on the exposed surface of the substrate; after the film is formed, discontinuing evaporation of either the group VI or group II material; and, allowing the film to cool while being bombarded by or subjected to a vapor of the remaining group II or VI material as the case may be. The cooling of the film within this remaining group II or VI material vapor must be discontinued at a temperature below which the vapor will condense on the film.

This method has been found to control substantially the resistivity of the film so as to produce either low or high resistivity cadmium telluride films as desired. If the group VI material is the remaining material, a controlled high resistivity film is obtained. On the other hand, and more importantly, if the group II material is the remaining material, a controlled low resistivity film is obtained. Thus, low resistivity films may be used as an efficient photovoltaic cell having a low ratio of weight to external generated electrical energy.

The primary object of the present invention is the provision of a method of forming a semiconducting film from a compound of group II material and group VI material which film has a drastically varied resistivity from the resistivity of films formed from the compound by conventional methods.

Another object of the present invention is the provision of a method of forming a semiconducting film formed from cadmium telluride which film has a lower resistivity than evaporated cadmium telluride films formed by conventional methods.

The present invention relates to controlling the resistivity of a vacuum deposited film, which is generally polycrystalline, by controlling the rate of evaporation of the materials forming the film. The resulting film has various applications, most of which require the use of this film with other structures, such as collectors and electrodes.

These and other objects and advantages will become apparent from the following description used to illustrate the preferred embodiment of the present invention as read in connection with the accompanying drawing in which the single figure is a cross-sectional view illustrating, somewhat schematically, an apparatus for performing the present invention.

Referring now to the drawing, there is shown an apparatus 10 for practicing the present invention. This apparatus may take a variety of structural forms; however, in accordance with the illustrated embodiment, apparatus 10 includes a somewhat conventional vacuum chamber in the form of a bell jar 12 resting upon a lower base 14. The upper surface 16 of the base is provided with an appropriate sealing material, and as it contacts the lower edge 18 of the bell jar, the jar is hermetically sealed in accordance with conventional practices. Within the vacuum chamber there is provided material receiving vessels 20, 22, 24 formed from a heat resistant material and surrounded by heating elements 21, 23, and 25, respectively. These vessels are somewhat tubular in shape and have upwardly facing mouths 26, 27, and 28, respectively. Various materials placed within these vessels or boats are heated by the heating elements 21, 23, 25 to form a vapor which is directed upwardly from the boats toward a substrate holder 32 positioned directly above the boats and adapted to support a substrate 34. This substrate is directly aligned with the vapor emitting from the boats. Since the boats are tubular with upper mouths, the vapors impinge on the substrate where they crystallize in a manner to be hereinafter described in detail. Of course, the holder 32 may or may not be a solid cylindrical structure. In practice, the support 32 includes an upper plate with lower support arms fastened within the bell jar.

As well be described later, the temperature of materials being vaporized within the boats must be accurately controlled; therefore, thermocouples 31, 33 and 35 are secured in heat conducting relationship with the boats. These thermocouples are connected onto appropriate control devices or thermometers (not shown) so that the temperature of each boat is known and can be accurately controlled. The particular control arrangement for maintaining a given temperature within each boat is well known in the art; therefore, it has been omitted for the purpose of simplicity. An electric resistance heater 36 is positioned above the substrate 34 and includes a heating element 37. A thermocouple 42 is positioned on the substrate 34 so that the temperature of the substrate is known at all times and can be varied by controlling the heater.

The vacuum chamber or bell jar 12 is evacuated by a somewhat standard evacuating system 38 which includes a mechanical vacuum pump and a diffusion pump. The system 38 is communicated with the interior of the vacuum chamber by a conduit 39 so that the pumps forming the system can lower the pressure within the vacuum chamber to a value approaching $1.0 \times 10^4$ mm. of mercury. The interior of the vacuum chamber is also communicated with an atmosphere port 40 and a conduit 41 connected with a supply 44 of inert gas. A valve (not shown) selectively closes the vacuum chamber or communicates the vacuum chamber with either atmosphere or the supply 44.

Boat 20 is provided with a shutter 45. This shutter may be swung back and forth to expose the mouth 26 of the boat. It is also possible to provide the other boats with shutters; however, this is not necessary to the successful operation of the present invention. A shutter 47 is provided beneath the substrate 34 to selectively cover or uncover the exposed lower surface of the substrate for controlling the actual bombardment of the substrate with the vapors from the boats. Shutter 47 is generally over the substrate except during disposition of crystalline film thereon and during cooling of the substrate to a preselected temperature discussed in detail later. The disclosed apparatus 10 may be varied since it forms no part of the present invention; however, this apparatus has proven quite satisfactory in carrying out the method in accordance with the present invention.

In accordance with a more specific aspect of the present invention, a group II material or a group II–VI compound, such as zinc, cadmium, mercury, zinc sulfide, zinc selenide, zinc telluride, cadmium sulfide, CdSe, CdTe, HgS, $HgS_e$, or HgTe, is deposited in boat 20. A group VI material, or a group II–VI compound, such as sulfur, selenium, tellurium, ZnS, ZnSe, ZnTe, CdS. CdSe. CdTe, HgS, HgSe, or HgTe, is deposited in boat 22. If desired, the boat 24 receives a group III material, such as indium, gallium or aluminum. Each of these materials is semiconductor grade, which is preferably 99.999% pure.

The substrate 34 is heated by the heater 36 to a temperature between 150° C. or 200° C. and 500° C. Below the lower or minimum temperature or temperatures, the cadmium or tellurium, or the other materials used, will tend to condense on the surface of the substrate without forming a compound polycrystalline film. This of course forms an unwanted barrier on the film. Above the higher or maximum temperature, the polycrystalline film tends to evaporate from the exposed surface of the substrate.

Each boat is heated to a temperature which will evaporate the material within the boats at a predetermined rate. These rates may be calculated by known procedures, and some of the preferred rates will be outlined in conjunction with specific examples of the present invention. When cadmium telluride is to be crystallized onto the substrate, boat 20, which includes the cadmium, is heated to a temperature between 350° C. and 500° C. Tellurium within boat 22 is heated to a temperature in the range of 400° C. to 500° C. This causes the cadmium and tellurium to evaporate together and travel to a position at least adjacent the exposed surface of the substrate. The substrate, which may be lime glass, molybdenum or a similar material, is held at the proper temperature to assure compounding and crystallization of the cadmium and tellurium as cadmium telluride on the substrate. In practice a thin sheet of molybdenum is used because of its flexibility, light weight and affinity for the compound film.

If a dopant, or impurity, is to be formed with the polycrystalline structure, the dopant material is placed in boat 24. Preferably, indium is used as the dopant, which coacts with the compound film to control the conductivity of the film. By doping the film with indium, a donor material, the film is n-type. Of course, the film could be doped with other materials, or the temperature of the substrate and the evaporization of the elements could be controlled to vary from stoichiometry, so that the material may be either p-type or n-type. When indium is used to control the conductivity, boat 24 is heated to a temperature of 850° C. to 1000° C.

The materials within the heated boats are compounded and deposited as a polycrystalline film on the substrate 34. By using the time-rate method of control, the thickness of the film may be maintained within preselected limits. The temperature of each boat determines to a great extent the evaporation rate and the impingement rate of the material within the boats. These rates are maintained for calculated periods to obtain the desired film thickness.

In accordance with the invention, heating elements 23, 25 of boats 22, 24 are de-energized after the film has reached the desired thickness. Thereafter the vapor from boat 20 fills the chamber 12, and the heater 36 is de-energized. This allows the substrate 34 to cool in an atmosphere of the group II material. After the substrate has cooled to a temperature of about 200° C., emission of the cadmium vapor from the boat 20 is stopped by interrupting current flow through the heating element 21 and/or covering boat 20 with shutter 45. This process reduces the resistivity of the film, especially when the film is formed from cadmium telluride. This allows the film to be used as an efficient photovoltaic cell or other semiconducting unit.

The theory of this reduced resistivity is not completely understood. It is believed that the high resistivity of conventional polycrystalline cadmium telluride film is caused by either a very low effective carrier mobility, probably due to electrical barriers at the grain boundaries, or a small carrier concentration, probably due to the inability of the film constituents to absorb excesses of cadmium or tellurium at the condensation or crystallization temperature in vacuum. Consequently, it can be theorized that the above process of cooling the substrate in a cadmium vapor atmosphere, until a given temperature is reached, either reduces the potential drop across the grain boundaries or forces a dissolution of excess elemental material into the compound. The latter explanation appears the more probable.

As will be shown by actual examples, cadmium telluride film produced by the above method may have a resistivity as low as 500 ohm-cm. at 25° C. This value is a drastic reduction of the resistivity of this type film since the normal resistivity is approximately $1.0\times10^{+7}$ or $1.0\times10^{+8}$ ohm-cm. Prior attempts to obtain this lower resistivity in evaporated films have been unsuccessful, and it is believed that the success is directly attributable to our novel method of producing the film which method includes evaporating excessive cadmium beyond the amount required for the compound film and cooling the film in an atmosphere of cadmium, and, more specifically, bombarding the film with a cadmium vapor. The precise control of discontinuing the film forming vapor and the cadmium vapor with respect to the temperature of the substrate is somewhat essential to the operation of the present method. The cadmium vapor must be removed from the vicinity of the film before the substrate reaches a temperature which will cause condensation of cadmium as an overlay on the polycrystalline film surface. These aspects of the present invention are novel and lead to the lowered resistivity of the film.

Hereinafter are examples of the present invention. They are only representative in nature, and a person skilled in the art of vapor disposition of crystalline structure, especially photovoltaic films, could develop slight variations which are expressly included in the intended spirit and scope of the present invention.

EXAMPLE A

To fully appreciate the impact of the present invention, a method previously used by us to form cadmium telluride polycrystalline film will be presented. This method does not incorporate some of the essential features of the present invention, although it does involve certain steps or procedures not generally known in the field of polycrystalline photovoltaic cells. In this prior example, elemental cadmium was placed in boat 20, elemental tellurium was placed in boat 22, and elemental indium was placed within boat 24. The substrate 34 comprised three 1 x 3-inch sheets of lime glass having a thickness of about 0.060 inch, and these sheets were supported in side-by-side relationship on the holder 32. Thereafter, the bell jar 12 was hermetically sealed, and the evacuating system reduced the internal pressure to about $1.0\times10^{-4}$ mm. Hg, absolute. Heating element 37 was controlled to hold the substrate 34 at a temperature of about 300° C. The cadmium tellurium and indium was then vaporized by heat supplied to the respective boats within the jar. The thermocouples 31, 33 and 35 indicated that boat 20 was heated to a temperature of about 293° C., boat 22 was heated to a temperature of about 403° C., and boat 24 was heated to a temperature of about 867° C. By appropriate calculations, which may be made by a person skilled in the art of vacuum disposition, the above temperatures caused the cadmium to have an evaporation rate of approximately $6.6\times10^{-6}$ moles/second and an impingement rate of approximately $1.3\times10^{-8}$ moles/cm.$^2$-second. The heated tellurium had an evaporation rate of approximately $3.3\times10^{-6}$ moles/second and an impingement rate of approximately $6.5\times10^{-9}$ moles/cm.$^2$-second; and the indium had an evaporation rate of approximately $1.25\times10^{-7}$ moles/second and an impingement rate of about $4.2\times10^{-11}$ moles/cm.$^2$-second.

The vaporized materials formed a polycrystalline cadmium telluride film on the lower surface of the substrate. After about 40 minutes, the heating elements were de-energized, and the substrate with the cadmium telluride film adhered thereto was allowed to cool to room temperature. The bell jar was then communicated to atmosphere and the coated substrate was removed.

The substrate was then cut into small specimens each measuring approximately 5 mm. x 20 mm., and the resistivity of each specimen was measured by first applying molten indium at each end of the specimen. The indium was solidified to form spaced end terminals. Also, two small pools of molten indium were placed on each surface of the specimen. These pools solidified to provide side terminals. By applying a power supply, of known voltage or current output, across the end terminals and/or the side terminals, the voltage drop across the specimen and through the specimen could be measured by appropriate probes. By this procedure, the resistivity of the cadmium telluride film was measured and found to be approximately $7.0\times10^{7}$ ohm-cm. at 25° C. This value is substantially higher than the resistivity desired for photovoltaic films.

EXAMPLE B

The method described as Example A was repeated with certain changes contemplated by the present invention. Again the substrate included three 1 x 3-inch sheets of lime glass which were maintained at approximately 300° C. The cadmium boat 20 was heated to a temperature of about 351° C. which caused an evaporation rate of approximately $6.10\times10^{-5}$ moles/second. The tellurium boat 22 was heated to a temperature of about 450° C. which caused an evaporation rate of approximately $3.0\times10^{-5}$ moles/second. Lastly, the indium boat was heated to a temperature of about 790° C. which caused an evaporation rate of approximately $6.0\times10^{-8}$ moles/second. These values of temperatures would cause given impingement rates which can be calculated; however, the calculations are omitted for purposes of simplicity.

At the end of the vacuum disposition, the heating elements 23, 25 and 37 were de-energized while the heating element 21 continued to heat the cadmium boat. This maintained the bombardment of the substrate by cadmium as the substrate cooled from 300° C. The rate of impingement by the cadmium vapor was calculated to correspond with a vapor pressure of approximately 0.229 mm. Hg at the substrate surface. The cadmium boat was deactivated when the substrate cooled to about 200° C. and the shutter 45 was moved over the boat 20 to prevent further substrate bombardment by cadmium vapor. The substrate temperature of 200° C. was selected because below 200° C. elemental cadmium metal would be deposited on the substrate to cover the crystalline film with an unwanted barrier layer.

After the above process was completed, specimens were made and appropriate terminals were attached. By using the same measuring procedure outlined with respect to Example A, the resistivity the specimens produced in accordance with the present invention had a resistivity of approximately 500 ohm-cm. at 25° C. This represents a substantial decrease in the film resistivity so that the cadmium telluride film is adapted for efficient use as a photovoltaic device. In addition, the film was tenaciously secured to the substrate after removal from the vacuum chamber. This feature has been heretofore troublesome in attempts to produce low resistivity cadmium telluride film.

EXAMPLE C

In accordance with the present invention the method used in Example B was repeated without using the indium doping material. The cadmium telluride film was allowed to cool in a cadmium vapor having a pressure of approximately 0.229 mm. Hg. The resistivity of the resulting film was $2.5\times10^{5}$ ohm-cm. at 25° C. This is a substantial decrease in resistivity over the specimen of Example A; however, this resistivity is substantially greater than the resistivity of the specimen of Example B.

The film formed by the present invention is vacuum deposited, and by controlling the evaporization rates, the resistivity of the film is controlled. After the film has been produced, collectors or electrodes and other support structures are connected to adapt the film for the intended use.

The present invention has been described in conjunction with certain specific examples; however, the invention is intended to include various other examples which are taught by the present application.

Having thus described our invention, we claim:

1. A method of forming a film on a substrate, said method comprising the following steps:

(a) providing an atmosphere controlled chamber;

(b) supporting a substrate in said chamber with an exposed surface;

(c) simultaneously evaporating a group VI material and a group II material in said chamber;

(d) heating said substrate to a temperature between 150° C. and 500° C., said temperature being above the condensation temperature of said group VI material and said group II material and being below the condensation temperature of the compound formed by the reaction of said group VI material and said group II material;

(e) holding said substrate at said temperature;

(f) allowing said material to form a compound film on said exposed surface of said substrate;

(g) after said film is formed, discontinuing evaporation of said group VI material and allowing said film to cool while being bombarded by vapor of said group II material to a temperature slightly higher than the condensation temperature of said group II material.

2. A method of forming a film as defined in claim 1 wherein said substrate is formed from glass.

3. A method of forming a film as defined in claim 1 wherein said substrate is formed from molybdenum.

4. A method of forming a film as defined in claim 1 wherein said group II material is cadmium.

5. A method of forming a film as defined in claim 4 wherein said group VI is tellurium.

6. A method of forming a film as defined in claim 5 wherein said substrate is heated to a temperature above 200° C. and allowed to cool to a temperature below 200° C. and including the step of discontinuing bombardment of said film by said group II material when said film is cooled to a temperature at which cadmium will condense on said film.

7. A method of forming a film as defined in claim 5 including the steps of evaporating a group III dopant material in said chamber while said film is forming and discontinuing evaporation of said dopant element while said film is cooling.

8. A method of forming a film as defined in claim 1 including the steps of evaporating indium in said chamber while said film is forming and discontinuing evaporation of said indium while said film is cooling.

9. A method of forming a film as defined in claim 1 including the steps of evaporating gallium in said chamber while said film is forming and discontinuing evaporation of said gallium while said film is cooling.

10. A method of forming a film as defined in claim 1 including the steps of evaporating aluminium in said chamber while said film is forming and discontinuing evaporation of said aluminum while said film is cooling.

11. A method of forming a film as defined in claim 1 including the step of directing said vapor of said group II and VI material toward said exposed surface of said substrate.

12. A method of forming a film as defined in claim 1 wherein said chamber is evacuated to form a high vacuum.

13. A method of forming a film as defined in claim 12 wherein said vacuum is at least $1.0\times10^{-4}$ mm. of mercury.

14. A method of forming a film on a substrate, said method comprising the following steps:

(a) providing a vacuum chamber;

(b) supporting a substrate in said chamber with an exposed surface;

(c) heating a source of cadmium in said chamber to an evaporation temperature in the range of 350° C. to 500° C.;

(d) heating a source of tellurium in said chamber to an evaporation temperature in the range of 500° C. to 550° C.;

(e) heating said substrate to a temperature above the condensation temperature of both cadmium and tellurium but below the condensation temperature of cadmium telluride;

(f) allowing a film of cadmium telluride to form on said exposed surface;

(g) stopping evaporation of said tellurium after said film has formed;

(h) allowing said substrate to cool in said cadmium atmosphere;

(i) discontinuing contact of the film with the cadmium atmosphere as the film temperature approaches the condensation temperature of cadmium so as to prevent the film from being coated with cadmium; and, (j) thereafter, allowing said substrate to cool to room temperature.

15. A method of forming a film as defined in claim 14 including the steps of heating a source of indium in said chamber to an evaporation temperature in the range of 850° C. to 1000° C. while said film is being formed and stopping evaporation of said indium after said film has formed and before said film has cooled to about 200° C.

16. A method of lowering the resistivity of cadmium-telluride photovoltaic film, said method comprising the following steps:

(a) depositing said cadmium-telluride film onto a substrate at a temperature of over 200° C.; and (b) cooling said film to approximately 200° C. in a predominantly cadmium vapor atmosphere.

17. A method of lowering the resistivity of cadmium-telluride photovoltaic film as defined in claim 16 including the steps of depositing indium with said film.

18. A method of forming a film on a substrate, said method comprising the following steps:

(a) providing an atmosphere controlled chamber;

(b) supporting a substrate in said chamber with an exposed surface;

(c) simultaneously evaporating a group II–VI compound and a group II material in said chamber;

(d) heating said substrate to a temperature between 150° C. and 500° C.;

(e) holding said substrate at said temperature;

(f) allowing said compound to form a compound film on said exposed surface of said substrate;

(g) after said film is formed, discontinuing evaporation of said group II–VI compound and allowing said film to cool while being bombarded by vapor of said group II material; and (h) discontinuing the bombardment of the film by vapor of said group II material prior to cooling to a temperature at which condensation of said group II material commences.

References Cited

UNITED STATES PATENTS

| | | | |
|---|---|---|---|
| 2,847,329 | 8/1958 | Schilberg et al. | 252—501 XR |
| 2,938,816 | 5/1960 | Günther | 252—501 XR |
| 2,994,621 | 8/1961 | Hugle et al. | 117—201 |
| 3,033,791 | 5/1962 | De Nobel et al. | 252—62.3 |
| 3,249,552 | 5/1966 | Lehmann | 252—301.6 |
| 3,312,571 | 4/1967 | Ruehrwein | 148—175 |

L. DEWAYNE RUTLEDGE, Primary Examiner

E. L. WEISE, Assistant Examiner

U.S. Cl. X.R.

117—201